(12) United States Patent (10) Patent No.: US 12,623,292 B2
Sasaki et al. (45) Date of Patent: May 12, 2026

(54) COATED TOOL

(71) Applicants: MOLDINO Tool Engineering, Ltd., Tokyo (JP); Oerlikon Surface Solutions AG, Pfaffikon, Pfaffikon (CH)

(72) Inventors: Tomoya Sasaki, Yasu (JP); Kazuyuki Kubota, Yasu (JP); Kumar Yalamanchili, Sargans (CH); Denis Kurapov, Walenstadt (CH); Wolfgang Kalss, Feldkirch (AT)

(73) Assignees: MOLDINO Tool Engineering, Ltd., Tokyo (JP); Oerlikon Surface Solutions AG, Pfaffikon, Pfaffikon (CH)

( * ) Notice: Subject to any disclaimer, the term of this patent is extended or adjusted under 35 U.S.C. 154(b) by 868 days.

(21) Appl. No.: 17/799,775

(22) PCT Filed: Feb. 19, 2021

(86) PCT No.: PCT/JP2021/006443
§ 371 (c)(1),
(2) Date: Aug. 15, 2022

(87) PCT Pub. No.: WO2021/167087
PCT Pub. Date: Aug. 26, 2021

(65) Prior Publication Data
US 2023/0097468 A1 Mar. 30, 2023

(30) Foreign Application Priority Data
Feb. 21, 2020 (JP) .................................. 2020-028679

(51) Int. Cl.
| | |
|---|---|
| *B23B 27/14* | (2006.01) |
| *B23C 5/16* | (2006.01) |
| *C23C 14/02* | (2006.01) |
| *C23C 14/06* | (2006.01) |
| *C23C 14/34* | (2006.01) |
| *C23C 14/50* | (2006.01) |
| *C23C 14/58* | (2006.01) |

(52) U.S. Cl.
CPC .............. *B23B 27/148* (2013.01); *B23C 5/16* (2013.01); *C23C 14/022* (2013.01); (Continued)

(58) Field of Classification Search
None
See application file for complete search history.

(56) References Cited

U.S. PATENT DOCUMENTS

| | | | | | |
|---|---|---|---|---|---|
| 2004/0115484 A1* | 6/2004 | Horling | ................. | C23C 30/005 | 428/698 |
| 2014/0287209 A1* | 9/2014 | Kurapov | ............... | C23C 14/325 | 428/218 |

(Continued)

FOREIGN PATENT DOCUMENTS

| | | |
|---|---|---|
| JP | H08-209333 A | 8/1996 |
| JP | 2000-297364 A | 10/2000 |

(Continued)

OTHER PUBLICATIONS

Office Action mailed May 23, 2023, issued for JP2022-501088 and English translation thereof.

(Continued)

*Primary Examiner* — David Sample
(74) *Attorney, Agent, or Firm* — Troutman Pepper Locke LLP; James E. Armstrong, IV

(57) ABSTRACT

A coated tool of the present invention includes a base material and a hard coating film on the base material. The hard coating film is a nitride or carbonitride containing aluminum (Al) of 65 atomic % or more 90 atomic % or less, titanium (Ti) of 10 atomic % or more 35 atomic % or less, a total of aluminum (Al) and titanium (Ti) of 85 atomic % or more, and argon (Ar) of 0.20 atomic % or less. The hard coating film satisfies a relationship of $Ih \times 100/Is \leq 12$ when a peak intensity of a (010) plane of AlN of a hexagonal (Continued)

close-packed structure is Ih and a sum of peak intensities due to predetermined nine crystal planes of TiN and AlN is Is in an intensity profile obtained from a selected area diffraction pattern of a transmission electron microscope.

16 Claims, 10 Drawing Sheets

(52) U.S. Cl.
CPC ...... *C23C 14/0641* (2013.01); *C23C 14/3464* (2013.01); *C23C 14/505* (2013.01); *C23C 14/5833* (2013.01)

(56)                    References Cited

U.S. PATENT DOCUMENTS

| | | | |
|---|---|---|---|
| 2020/0198017 A1 | 6/2020 | Sasaki | |
| 2020/0298316 A1 | 9/2020 | Sasaki et al. | |
| 2020/0376567 A1* | 12/2020 | Isaka | C23C 14/0664 |

FOREIGN PATENT DOCUMENTS

| | | | | | |
|---|---|---|---|---|---|
| JP | 2001-179502 | A | 7/2001 | | |
| JP | 2011-189419 | A | 9/2011 | | |
| JP | 2013-202700 | A | 10/2013 | | |
| JP | 5673904 | B1 | 2/2015 | | |
| WO | WO-2014157688 | A1 * | 10/2014 | ......... | C23C 14/0635 |
| WO | 2017/094440 | A1 | 6/2017 | | |
| WO | 2017/170536 | A1 | 10/2017 | | |
| WO | 2019/035220 | A1 | 2/2019 | | |
| WO | 2019/048507 | A1 | 3/2019 | | |
| WO | 2019/065397 | A1 | 4/2019 | | |

OTHER PUBLICATIONS

International Search Report mailed Apr. 20, 2021, issued for PCT/JP2021/006443 and English translation thereof.
Supplementary European Search Report mailed Mar. 6, 2024, issued for European Patent Application No. 21756437.6.

* cited by examiner

COATED TOOL

TECHNICAL FIELD

The present invention relates to a coated tool applied to a tool such as a mold or a cutting tool.

Priority is claimed on Japanese Patent Application No. 2020-028679, filed Feb. 21, 2020, the content of which is incorporated herein by reference.

BACKGROUND ART

Al and Ti nitride or carbonitride (hereinafter, referred to as AlTiN or AlTiCN) are film types with excellent wear resistance and heat resistance, and are widely applied to coated molds and coated cutting tools. Generally, in AlTiN and AlTiCN, when an Al content ratio increases, AlN of a fragile hexagonal close-packed structure (hereinafter, also referred to as hcp structure) increases. When the AlN of the hcp structure increases, the hardness of the hard coating film decreases and the tool performance decreases (Patent Document 1).

In AlTiN or AlTiCN, even when only a peak intensity of a face-centered cubic structure (hereinafter, referred to as an fee structure) is measured by X-ray diffraction, a microstructure may contain AlN having an hcp structure. Under harsh usage environments such as increasing the hardness and the cutting speed of the work material, the tool performance tends to deteriorate due to an increase in AlN of the hcp structure contained in the microstructure of the hard coating film. In response to such problems, as a coated cutting tool suitable for cutting high-hardness steel, the applicant of the present application provides a coated cutting tool in which Al-rich AlTiN or AlTiCN with reduced hcp-structure AlN contained in a microstructure is provided on an intermediate film formed by titanium bombardment (Patent Document 2).

In specific examples of Patent Documents 1 and 2, an arc ion plating method is applied among physical vapor deposition methods. The physical vapor deposition method is mainly applied to coated cutting tools for milling in order to apply residual compressive stress to a hard coating film to improve fracture resistance. Among the physical vapor deposition methods, the arc ion plating method is widely used because a target ionization rate is high and a hard coating film having excellent adhesion to a base material can be obtained. In the arc ion plating method, since the target component is evaporated and coated by arc discharge, the hard coating film inevitably contains a large amount of droplets of several micrometers.

On the other hand, since the sputtering method in which the target component is sputtered with argon gas and coated is less likely to generate droplets among the physical vapor deposition methods, a smooth hard coating film can be obtained. However, in the sputtering method, the ionization rate of the target is lower than that in the arc ion plating method, so that voids are easily formed inside the hard coating film and the adhesion between the hard coating film and the base material is poor. Therefore, in general, the hard coating film coated by the sputtering method tends to have lower durability than the hard coating film coated by the arc ion plating method.

For small-diameter tools, the influence of droplets present on the surface of the hard coating film is large with respect to the tool diameter. Therefore, if the hard coating film having excellent durability can be coated by the sputtering method, further improvement in tool performance is expected in a small-diameter tool such as a small-diameter end mill having a tool diameter of 3 mm or less and further 2 mm or less.

In recent years, in order to increase the ionization rate of a target, a coated cutting tool coated with AlTiN by a high-power sputtering method in which electric power applied to the target is instantaneously increased has begun to be proposed (Patent Documents 3 to 5). Patent Document 6 shows that Al-rich AlTiN coated by a high-power sputtering method has an fcc structure by X-ray diffraction.

CITATION LIST

Patent Document

[Patent Document 1]
   Japanese Unexamined Patent Application No. Hei8-209333
[Patent Document 2]
   International Publication No. 2014/157688
[Patent Document 3]
   Japanese Unexamined Patent Application No. 2011-189419
[Patent Document 4]
   Japanese Unexamined Patent Application No. 2013-202700
[Patent Document 5]
   International Publication No. 2017/170536
[Patent Document 6]
   International Publication No. 2019/48507

SUMMARY OF INVENTION

Technical Problem

Regarding Al-rich AlTiN coated by the sputtering method, reducing the inevitably contained argon and the AlN of the hcp structure contained in the microstructure has not been sufficiently studied, and there is room for improvement in the durability of the coated tool.

In view of the above-described circumstances, an object of the present invention is to reduce defects contained in a hard coating film mainly composed of Al-rich AlTiN or AlTiCN and coated by a sputtering method and to improve durability of a coated tool.

Solution to Problem

According to the present invention, provided is a coated tool including: a base material; and a hard coating film on the base material, wherein the hard coating film is a nitride or carbonitride which contains aluminum (Al) of 65 atomic % or more and 90 atomic % or less and titanium (Ti) of 10 atomic % or more and 35 atomic % or less with respect to a total amount of metal (including metalloid) elements, a total of aluminum (Al) and titanium (Ti) of 85 atomic % or more, and argon (Ar) of 0.20 atomic % or less with respect to a total amount of metal (including metalloid) elements and non-metal elements, and wherein the hard coating film satisfies a relationship of $Ih \times 100/Is \leq 12$ when a peak intensity due to a (010) plane of AlN of a hexagonal close-packed structure is Ih and a sum of a peak intensity due to a (111) plane of AlN, a (111) plane of TiN, a (200) plane of AlN, a (200) plane of TiN, a (220) plane of AlN, and a (220) plane of TiN of a face-centered cubic structure and a peak intensity due to a (010) plane of AlN, a (011) plane of AlN, and a (110) plane of AlN of a hexagonal close-packed structure is Is in an intensity profile obtained from a selected area diffraction pattern of a transmission electron microscope.

The hard coating film may have a structure having a region mainly composed of relatively coarse particles and a region mainly composed of relatively fine particles.

An average crystal grain size of the region mainly composed of the relatively coarse particles may be 1.2 times or more and 4.0 times or less the average crystal grain size of the region mainly composed of the relatively fine particles.

The value of Ih×100/Is may be 0 to 8 in the region mainly composed of the relatively coarse particles and the value of Ih×100/Is may be 4 to 12 in the region mainly composed of the relatively fine particles.

The hard coating film may be provided directly above the base material.

The hard coating film may have a nanoindentation hardness of 30 GPa or more and an elastic modulus of 500 GPa or more.

Advantageous Effects of Invention

According to the present invention, it is possible to obtain a coated tool having excellent durability.

DESCRIPTION OF EMBODIMENTS

Figure 1:
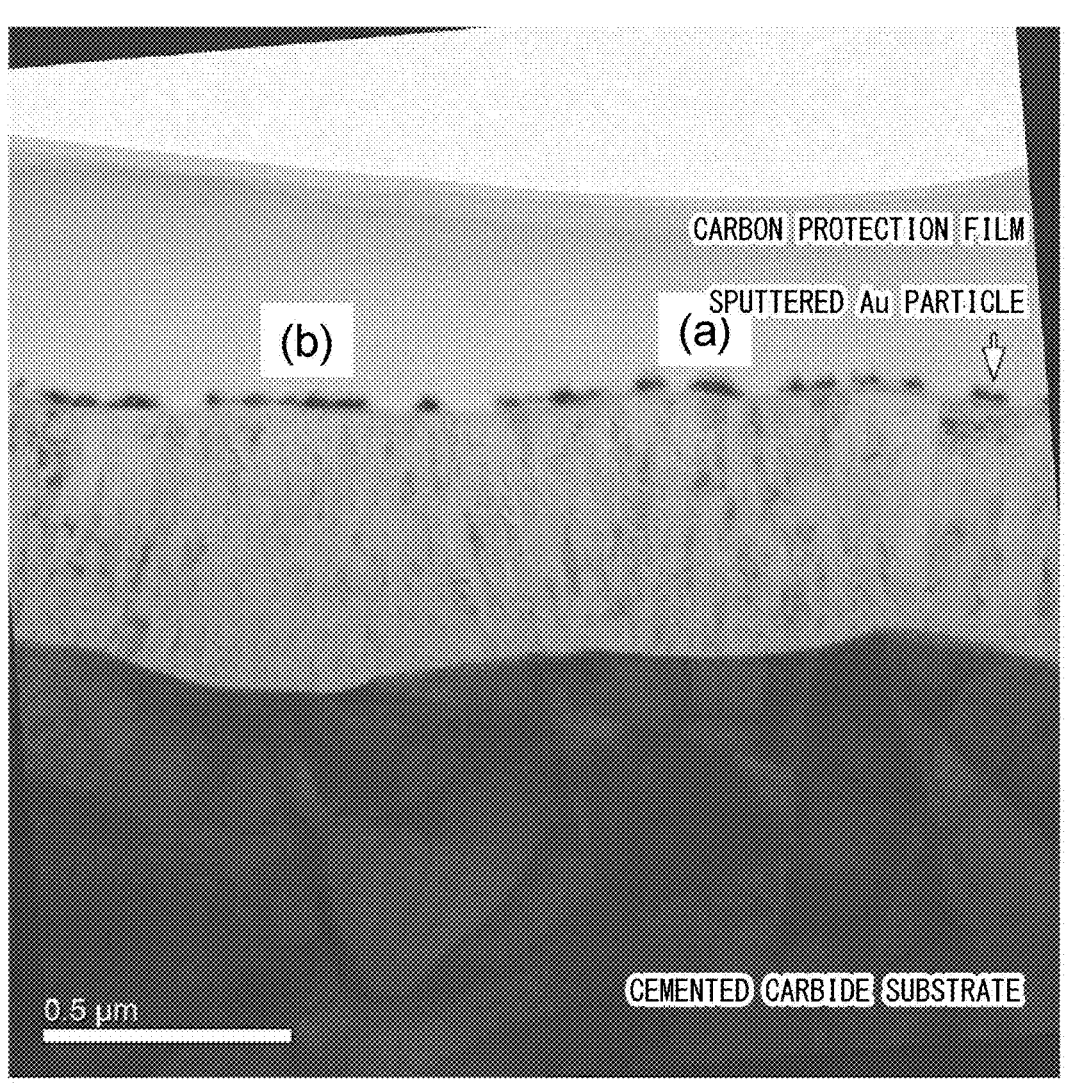
FIG. 1 is an example of a cross-sectional observation photograph of a hard coating film having a region mainly composed of relatively coarse particles and a region mainly composed of relatively fine particles by a transmission electron microscope.

The present inventor has found that durability is improved by controlling a content ratio of argon (Ar) with respect to a total of metallic elements and non-metallic elements and reducing AlN of an hcp structure at a micro level in a coated tool coated with Al-rich Al and Ti nitrides or carbonitrides by a sputtering method. Hereinafter, the details of the embodiment of the present invention will be described.

The coated tool of this embodiment is a coated tool having Al and Ti nitrides or carbonitrides on a surface of a base material. The coated tool of this embodiment can be applied to a mold or a cutting tool. In particular, it is preferable to apply the coated tool to a small-diameter end mill having a tool diameter of 3 mm or less and more preferably 2 mm or less.

4

<Base Material>

In this embodiment, the base material is not particularly limited. Cold work tool steel, hot work tool steel, high-speed steel, cemented carbide, or the like may be appropriately applied according to the application. The base material may be subjected to nitriding treatment, metal bombardment treatment, or the like in advance. Further, mirror-polishing may be performed by wrapping or the like.

<Aluminum (Al) and Titanium (Ti)>

A hard coating film according to this embodiment is a nitride or a carbonitride, contains aluminum (Al) of 65 atomic % or more and 90 atomic % or less and titanium (Ti) of 10 atomic % or more and 35 atomic % or less with respect to a total amount of metal (including metalloid) elements, and contains a total of aluminum (Al) and titanium (Ti) of 85 atomic % or more. The nitride or carbonitride mainly composed of Al and Ti is a film type having an excellent balance between wear resistance and heat resistance, and has excellent adhesion to a base material. The heat resistance of the film is further improved by increasing the Al content ratio. Further, since an oxidation protective film is easily formed on the tool surface and a film structure becomes finer by increasing the Al content ratio, wear of the hard coating film due to welding is easily suppressed.

In order to fully exhibit the effect of adding Al, the hard coating film according to this embodiment has an Al content ratio of 65% atomic % or more when the total metal (including metalloids; the same applies hereinafter) element is 100 atomic %. More preferably, the Al content ratio is 70 atomic % or more. More preferably, the Al content ratio is 75 atomic % or more. On the other hand, when the Al content ratio becomes too large, AlN of an hcp structure increases and the toughness of the hard coating film decreases. Therefore, the Al content ratio of the hard coating film according to this embodiment is 90 atomic % or less when the total metal element is 100 atomic %. More preferably, the Al content ratio is 85 atomic % or less.

The hard coating film according to this embodiment has a Ti content ratio of 10 atomic % or more when the total metal element is 100 atomic %. More preferably, the Ti content ratio is 15 atomic % or more. Accordingly, excellent wear resistance can be imparted to the hard coating film. On the other hand, when the Ti content ratio of the hard coating film becomes too large, it is difficult to obtain the effect of increasing the Al content ratio. Therefore, the hard coating film according to this embodiment has a Ti content ratio of 35 atomic % or less when the total metal element is 100 atomic %. More preferably, the Ti content ratio is 30 atomic % or less. More preferably, the Ti content ratio is 25 atomic % or less.

The hard coating film according to this embodiment contains a total of Al and Ti of 85 atomic % or more when the total metal element is 100 atomic % in order to impart excellent durability to the coated tool. More preferably, the total of Al and Ti is 90 atomic % or more. Further, the hard coating film according to this embodiment may be a nitride or a carbonitride of Al and Ti. Nitride, which is a film type having more excellent heat resistance, is preferable.

The content ratio of the metal element in the hard coating film according to this embodiment can be measured by using an electron probe microanalyzer (EPMA) for the mirror-polished hard coating film. In this case, for example, the content ratio can be obtained from the average of 5 analysis points in the analysis range having a diameter of about 1 μm after mirror-polishing on the hard coating film surface.

<Metal Element Other than Aluminum (Al) and Titanium (Ti)>

The hard coating film according to this embodiment may contain a metal element other than Al and Ti. For example, the hard coating film according to this embodiment may contain elements of groups 4a, 5a, and 6a of the periodic table and one or more elements selected from Si, B, and Y for the purpose of improving wear resistance and heat resistance. These elements are commonly included to improve the coating property of the coated tool. Metal elements other than Al and Ti can be added within a range that does not significantly reduce the durability of the coated tool. However, if the content ratio of metal elements other than aluminum (Al) and titanium (Ti) becomes too large, the durability of the coated tool may decrease. Therefore, when the hard coating film according to this embodiment contains a metal element other than aluminum (Al) and titanium (Ti), the total content ratio is preferably 12 atomic % or less.

<Argon (Ar)>

The hard coating film according to this embodiment contains argon (Ar) of 0.20 atomic % or less with respect to the total amount of metal elements and non-metal elements.

Droplets, which are defects in the hard coating film, can be reduced in frequency by applying the sputtering method. On the other hand, in the sputtering method, since the target component is sputtered using argon ions, the hard coating film coated by the sputtering method contains a considerable amount of argon. In particular, argon tends to be concentrated at the grain boundaries, and the content ratio of argon tends to increase as the crystal grain size becomes finer. As in the case of the hard coating film according to this embodiment, when the Al content ratio is increased, the structure of the hard coating film tends to become finer and the grain boundaries increase, so that a large amount of argon is likely to be contained. Since the bonding force between the particles decreases at the grain boundaries when the content ratio of argon increases, it is effective to increase the Al content ratio of the hard coating film and keep the argon content ratio below a certain level in order to impart excellent durability to the coated tool. Specifically, the hard coating film according to this embodiment contains argon of 0.20 atomic % or less with respect to the total amount of metal elements and non-metal elements. More preferably, the hard coating film of this embodiment contains argon of 0.10 atomic % or less.

Additionally, the hard coating film according to this embodiment may also contain a rare gas other than argon by sputtering using a mixed gas containing a rare gas other than argon.

In the sputtering method, if the argon content ratio of the hard coating film is made as close to 0 atomic % as possible, the flow rate of argon becomes too small and the sputtering becomes unstable. Further, even if the argon content ratio approaches 0 atomic %, the basic characteristics as the hard coating film applied to the tool such as toughness, heat resistance, and wear resistance may be impaired. In the hard coating film according to this embodiment, the lower limit of the argon content ratio is not particularly limited, but it is preferable to contain argon of 0.02 atomic % or more in order to stabilize the sputtering method and secure the basic film characteristics as the hard coating film applied to the coated tool.

<Nitrogen (N)>

In the hard coating film according to this embodiment, when the content ratio of metal (including metalloid) elements, nitrogen, oxygen, carbon, and argon is 100 atomic %, the value of the ratio N/Me of the nitrogen element content ratio N and the metal (including metalloid) element content ratio Me is preferably 1.0 or more. Accordingly, nitride is sufficiently formed on the hard coating film and tends to have excellent durability. However, if the nitrogen content ratio becomes too large, the hard coating film tends to self-destruct, so the value of the ratio N/Me is preferably 1.1 or less.

Similar to the measurement of the metal element content ratio described above, the content ratio of nitrogen and argon of the hard coating film according to this embodiment can be measured using an electron probe microanalyzer (EPMA) for a mirror-polished hard coating film. Similar to the measurement of the content ratio of the metal element described above, the content ratio can be obtained from the average of 5 analysis points in the analysis range having a diameter of about 1 μm after mirror-polishing.

The hard coating film according to this embodiment may contain small amounts of argon, oxygen, and carbon in addition to nitrogen as non-metal elements.

<Oxygen (O) and Carbon (C)>

The hard coating film according to this embodiment is a nitride or a carbonitride, but may contain a small amount of oxygen. Since oxygen forms a small amount of oxide in the hard coating film, toughness might be reduced. If the oxygen inevitably contained in the hard coating film can be reduced, the toughness of the hard coating film can be increased. Moreover, even in the case of a nitride, it may contain a small amount of carbon.

In the hard coating film according to this embodiment, in order to minimize the small amount of oxides contained in the hard coating film, the oxygen content ratio is preferably 5.0 atomic % or less. More preferably, the oxygen content ratio is 4.0 atomic % or less. Further, since the durability of the coated tool tends to decrease if the amount of carbide contained in the hard coating film becomes too large, the carbon content ratio is preferably 5.0 atomic % or less. More preferably, the carbon content ratio is 3.0 atomic % or less.

<Crystal Structure>

The hard coating film according to this embodiment has a small amount of AlN of an hcp structure contained in the microstructure. Since the amount of AlN in the hcp structure contained in the microstructure is small, the durability of the coated tool having a large Al content ratio is improved.

In order to quantitatively determine the AlN of the hcp structure present in the microstructure of the hard coating film, for the processed cross-section of the hard coating film, the selected area diffraction pattern is obtained using a transmission electron microscope, and the intensity profile obtained from the selected area diffraction pattern is used. Specifically, the brightness of the selected area diffraction pattern is converted and the intensity profile is obtained from the selected area diffraction pattern, where the horizontal axis is the distance from the center of the (000) plane spot (radius r) and the vertical axis is the integrated intensity (arbitrary unit) for one circumference of each radius r. Then, the relationship of $Ih \times 100/Is$ is evaluated in the intensity profile of the selected area diffraction pattern of the transmission electron microscope. In this evaluation, the background value of the intensity profile is removed. The measurement location is the cross-section in the film thickness direction. Ih and Is are defined as follows.

Ih: Peak intensity due to the (010) plane of AlN in the hcp structure.

Is: Sum of the peak intensity due to the (111) plane of AlN, the (111) plane of TiN, the (200) plane of AlN, the (200) plane of TiN, the (220) plane of AlN, and the (220) plane of TiN of the fcc structure and the peak intensity due to the (010) plane of AlN, the (011) plane of AlN, and the (110) plane of AlN of the hcp structure.

By evaluating the relationship between Ih and Is, the AlN of the hcp structure contained in the microstructure can be quantitatively evaluated. A smaller value of $Ih \times 100/Is$ means less AlN of the fragile hcp structure present in the microstructure.

In this embodiment, a coated cutting tool having satisfactory durability has been realized as the hard coating film is configured to satisfy $Ih \times 100/Is \leq 12$. Further, it is preferable that the hard coating film has a structure in which the peak intensity due to the (010) plane of AlN of the hcp structure is not confirmed, that is, the hard coating film satisfies $Ih \times 100/Is = 10$ or less. Even when the selected area diffraction pattern confirms the AlN diffraction pattern of the hcp structure, if the amount is very small, no peak appears in the intensity profile and the value of $Ih \times 100/Is$ may be 0.

When the Al content ratio is less than 78 atomic %, the hard coating film according to this embodiment tends to have a substantially uniform structure. On the other hand, in the hard coating film according to this embodiment, when the Al content ratio of the hard coating film becomes 78 atomic % or more and further 80 atomic % or more, the structure tends to be a mixture of a region mainly composed of relatively coarse particles and a region mainly composed of relatively fine particles due to the influence of the surface condition of the base material. A region mainly composed of relatively coarse particles tends to be formed on the smooth base material. A region mainly composed of relatively fine particles tends to be formed on the base material having many irregularities. In this embodiment, the value of $Ih \times 100/Is$ is 12 or less in any region.

In the region mainly composed of relatively coarse particles, the AlN of the hcp structure present in the microstructure tends to be relatively small. In the region mainly composed of relatively coarse particles, the value of $Ih \times 100/Is$ is preferably 0 to 8. The region mainly composed of relatively coarse particles tends to have excellent toughness. On the other hand, in the region mainly composed of relatively fine particles, AlN of the hcp structure present in the microstructure tends to be relatively large. In the region mainly composed of relatively fine particles, the value of $Ih \times 100/Is$ is preferably 4 to 12. The region mainly composed of relatively fine particles tends to have excellent wear resistance. It is preferable that there are many regions mainly composed of relatively fine particles.

<Average Crystal Grain Size>

The hard coating film according to this embodiment preferably has an average crystal grain size of 5 mu or more. If the microstructure of the hard coating film becomes too fine, the structure of the hard coating film becomes close to amorphous, and the toughness is significantly reduced. In order to increase the crystallinity of the hard coating film and reduce the fragile amorphous phase, it is preferable that the average crystal grain size of the hard coating film is 5 nm or more. More preferably, the average crystal grain size of the hard coating film is 20 nm or more. In addition, if the microstructure of the hard coating film becomes too coarse, the toughness will decrease and the fracture unit of the hard coating film will increase. Accordingly, the tool damage becomes larger. In order to increase the toughness of the hard coating film and reduce the fracture unit to suppress tool damage, it is preferable that the average crystal grain size of the hard coating film is 100 nm or less. More preferably, the average crystal grain size of the hard coating film is 80 nm or less.

If the structure difference inside the hard coating film is large, the strength will decrease. Therefore, even when the structure is a mixture of a region mainly composed of relatively coarse particles and a region mainly composed of relatively fine particles, it is preferable that the average crystal grain size of the region mainly composed of relatively coarse particles is 1.2 times or more and 4.0 times or less the average crystal grain size of the region mainly composed of relatively fine particles. Further, it is preferable that the ratio is 3.0 times or less.

For the average crystal grain size of the hard coating film according to this embodiment, the width of the crystal particles is measured in the direction perpendicular to the film thickness direction using a transmission electron microscope. It is preferable to measure the width of 10 or more crystal particles and use the average value thereof as the average crystal grain size.

<Droplet>

The hard coating film according to this embodiment preferably has 5 or less droplets having a circular equivalent diameter of 1 μm or more per 100 μm$^2$ in cross-sectional observation. Droplets can be the main physical defect in the hard coating film coated by physical deposition. In particular, since a coarse droplet having a circular equivalent diameter of 1 μm or more can be a starting point of fracture inside the hard coating film, the toughness of the hard coating film can be increased by reducing the frequency of occurrence. In this embodiment, when observing the cross-section of the hard coating film, it is preferable that the number of droplets having a circular equivalent diameter of 1 μm or more is 5 or less per 100 μm$^2$. More preferably, the number is 3 or less per 100 μm$^2$. Further preferably, the number is 1 or less per 100 μm$^2$. Furthermore, it is preferable not to contain droplets having a circular equivalent diameter of 5 μm or more.

As for the surface of the hard coating film, it is preferable that the number of droplets having a circular equivalent diameter of 1 μm or more is 5 or less per 100 μm$^2$. More preferably, the number of droplets on the surface of the hard coating film is 3 or less per 100 μm$^2$. Further preferably, the number of droplets on the surface of the hard coating film is 1 or less per 100 μm$^2$.

The "droplet" in the present specification is a deposit on the hard coating film caused by metal particles of about 1 to several tens of μm that are suddenly scattered from a target.

In order to evaluate droplets in cross-sectional observation of the hard coating film, the hard coating film is mirror-polished and then processed by the focused ion beam method to prepare an observation sample. Multiple fields of view on the mirror-polished surface of the observation sample are observed at a magnification of 5,000 to 10,000 times by using a transmission electron microscope. Further, the number of droplets on the surface of the hard coating film can be determined by observing the surface of the hard coating film using a scanning electron microscope (SEM) or the like.

<Intermediate Film>

The hard coating film according to this embodiment is preferably provided directly above the base material. Since the crystallinity of the hard coating film is enhanced by providing the hard coating film directly above the base material, it tends to be easier to obtain a crystal structure having a face-centered cubic structure. The mechanism of this is unknown, but it is presumed that the surface condition of the base material, the kinetic energy of the particles reaching the base material, and the epitaxial growth on the base material had an effect. It is preferable that the coated tool of this embodiment is provided directly above the base material because the generation of AlN having an hcp structure at a micro level can be more stably suppressed. Depending on the manufacturing conditions, it is possible to suppress an increase of AlN of the hcp structure even if an intermediate film is provided. Therefore, the coated tool of this embodiment may be provided with an intermediate film. For example, a layer made of any of metal, nitride, carbonitride, and carbide may be provided between the base material of the tool and the hard coating film.

<Hardness/Elastic Modulus>

The hard coating film according to this embodiment preferably has a nanoindentation hardness of 30 GPa or more and an elastic modulus of 500 GPa or more. Accordingly, the hardness and elastic modulus of the hard coating film are improved and the durability of the coated tool is improved. Further, the hard coating film according to this embodiment preferably has a nanoindentation hardness of 35 GPa or more. The hard coating film according to this embodiment preferably has an elastic modulus of 550 GPa or more.

<Upper Layer>

In the coated tool of this embodiment, another hard coating film having a different component ratio or a different composition from the hard coating film according to this embodiment may be separately formed on the hard coating film according to this embodiment. Further, the hard coating film according to this embodiment and another hard coating film having a different component ratio or a different composition from the hard coating film according to this embodiment may be laminated with each other.

<Manufacturing Method>

When coating the hard coating film according to this embodiment, a sputtering method is applied in which 3 or more AlTi alloy targets are used, power is applied to the targets in sequence, and a time is provided during which the power is applied to both the target at which the power application ends and the target at which the power application starts at the same time when the target to which the power is applied is switched. In such a sputtering method, a state in which the target ionization rate is high is maintained in the coating, a hard coating film that is fine and dense at the micro level can be obtained, and the amount of argon and oxygen that is inevitably contained tends to be small. Then, it is preferable to promote the ionization of the target component and nitrogen to reduce the AlN of the hcp structure at the micro level such that the temperature inside the sputtering apparatus is 200° C. to 400° C., the bias voltage of the negative pressure applied to the base material is −200V to −50V, and the pressure inside the furnace is 0.1 Pa to 0.4 Pa by introducing Ar gas and N2 gas. Further, when coating carbonitride as a hard coating film, a small amount of carbon may be added to the target for forming the hard coating film or apart of the reaction gas may be replaced with methane gas. Further, in order to reduce AlN of the hcp structure at the micro level, it is effective to appropriately set the distance between the target and the base material. By setting the shortest distance between the target and the base material to 50 mm to 100 mm, the state of plasma to which the base material is exposed during coating becomes constant, and a face-centered cubic structure tends to be formed.

The maximum power density of the power pulse is preferably 0.5 kW/cm² or more. However, if the power density applied to the target becomes too large, it will be difficult to stabilize the film formation. Further, if the power density becomes too high, the frequency of droplet generation tends to increase even in the sputtering method. Therefore, the maximum power density of the power pulse is preferably 3.0 kW/cm² or less and further the maximum power density of the power pulse is preferably 2.0 kW/cm² or less. The average power density of the power pulse is preferably 0.10 to 0.30 kW/cm². The time of the power pulse applied to each target is preferably 20 microseconds or more. Further, it is preferable that the time during which the electric power is simultaneously applied to both the alloy target at which the application of electric power is completed and the alloy target at which the application of electric power is started is 5 microseconds or more and 100 microseconds or less.

Example 1

In "Example 1", the film characteristics were evaluated.

<Base Material>

As the base material, a two-flute ball end mill (manufactured by MOLDINO Co., Ltd.) made of cemented carbide having a composition of WC (bal.)-Co (8.0% by mass)-VC (0.3% by mass)-$Cr_3C_2$ (0.5% by mass) and hardness 94.0HRA (Rockwell hardness, according to JIS G0202) was prepared.

In the film formation of the hard coating film in Examples 1 to 5 and Comparative Examples 1 to 4, a sputtering apparatus capable of mounting 6 sputtering evaporation sources was used. In these vapor deposition sources, 3 AlTi alloy targets were installed in the apparatus as vapor deposition sources in order to coat the hard coating film. Additionally, a target having a size of $\phi16$ cm and a thickness of 12 mm was used.

In the coating of the hard coating film, in Example 1, an Al85Ti15 alloy target (numerical value is an atomic ratio; the same applies hereinafter) was used. In Example 2, an Al80Ti10Cr10 alloy target was used. In Examples 3 to 5 and Comparative Examples 2 to 4, an Al80Ti20 alloy target was used. In Comparative Example 1, an Al75Ti25 alloy target was used.

In each sample, an Al60Ti40 alloy target was used for coating the intermediate film.

A tool as a base material was fixed to the sample holder in the sputtering apparatus, and the bias power supply was connected to the tool. Additionally, the bias power supply has a structure in which a negative bias voltage is applied to the tool independently of the target. The tool rotates at two revolutions per minute and revolves via a fixing jig and a sample holder.

As the introduction gas, Ar and $N_2$ were used, and the introduction gas was introduced from the gas supply port provided in the sputtering apparatus.

Regarding the tool installation method, in installation method 1, the shortest distance between each target and the base material was set to 100 mm on average. In the installation method 2, the shortest distance between each target and the base material was set to 125 mm on average. In the installation method 3, the shortest distance between each target and the base material was 170 mm on average.

<Bombardment Treatment>

First, before coating the tool with a hard coating film, the tool was subjected to a bombardment treatment according to the following procedure. Heating was performed for 30 minutes in a state in which the temperature inside the furnace was 430° C. by the heater in the sputtering apparatus. After that, the inside of the furnace of the sputtering apparatus was evacuated, and the pressure inside the furnace was set to $5.0 \times 10^{-3}$ Pa or less. Then, Ar gas was introduced into the furnace of the sputtering apparatus, and the pressure inside the furnace was adjusted to 0.8 Pa. Then, a DC bias voltage of −170 V was applied to the tool to perform cleaning (bomberd treatment) of the tool with Ar ions.

<Coating of Hard Coating Film>

Next, the temperature inside the furnace was set to the set temperature, and Ar gas and $N_2$ gas were introduced into the furnace of the sputtering apparatus to adjust the pressure inside the furnace. Then, electric power was continuously applied to the 3 AlTi alloy targets to coat an intermediate film of about 0.2 μM composed of Al and Ti nitrides having an fcc structure. Next, a DC bias voltage was applied to the base material so that the overlap time of the electric power applied to the target was 10 microseconds, and the discharge time per cycle of the electric power applied to the target was adjusted. Then, electric power was continuously applied to the 3 AlTi alloy targets to coat the surface of the base material with a hard coating film of about 3.0 μm.

An arc ion plating apparatus was used to form the hard coating film of Comparative Example 5. An AlTi alloy target was installed in the apparatus as a vapor deposition source. Additionally, a target having a size of ϕ16 cm and a thickness of 12 mm was used.

The tool was cleaned (bombardment treatment) with Ar ions in the same manner as in the hard coating film forming step of Example 1. Next, the pressure inside the arc ion plating apparatus was evacuated to $5.0 \times 10^{-3}$ Pa or less, the temperature inside the furnace was set to 500° C., and N2 gas was introduced so that the pressure inside the furnace was 4.0 Pa. Next, a DC bias voltage was applied to the base material, and a current of 150 A was applied to the AlTi alloy target to coat the surface of the tool with a hard coating film of about 3.0 μm. Table 1 summarizes the film formation conditions of each sample.

10 kV, an irradiation current of $5 \times 10^{-8}$ A, and an uptake time of 10 seconds, 5 points in the range of the analysis region having a diameter of about 1 μm were measured, and the metal content ratio of the hard coating film and the argon content ratio in the total of the metal component and the non-metal component were determined from the average value.

<X-ray Analysis>

The crystal structure of the hard coating film was confirmed by using an X-ray diffractometer (EMPYREA manufactured by PANalytical Co., Ltd.) under measurement conditions of a tube voltage of 45 kV, a tube current of 40 mA, an X-ray source Cukα (λ=0.15405 nm), and 2θ of 20 to 80°.

<Film Hardness and Elastic Modulus>

The film hardness and elastic modulus of the hard coating film were analyzed using a nanoindentation tester (ENT-2100 manufactured by Elionix Inc.). For the analysis, a region in which the maximum indentation depth was less than about 1/10 of the film thickness was selected in the polished surface of the film after mirror-polishing the cross-section of the film in which the test piece was tilted 5° with respect to the outermost surface of the film. 10 points were measured under the measurement condition of a pushing load of 9.8 mN/sec, and the average value of 6 points excluding 2 points on the large value side and 2 points on the small value side was obtained.

<TEM Analysis>

The selected area diffraction pattern of the hard coating film was determined under the conditions of an acceleration

TABLE 1

| Sample No. | Film forming method | Maximum power (kw) | Power apply time (ms) | Bias voltage (V) | Film forming temperature (° C.) | $N_2$ pressure (Pa) | Ar pressure (Pa) | Total Pressure (Pa) | Installation method |
|---|---|---|---|---|---|---|---|---|---|
| Example 1 | High-powert sputter | 45 | 1 | −120 | 200 | 0.11 | 0.20 | 0.31 | 2 |
| Example 2 | High-power sputter | 40 | 30 | −160 | 200 | 0.07 | 0.10 | 0.17 | 2 |
| Example 3 | High-power sputter | 45 | 30 | −120 | 200 | 0.11 | 0.20 | 0.31 | 1 |
| Example 4 | High-power splitter | 45 | 30 | −160 | 230 | 0.07 | 0.10 | 0.17 | 3 |
| Example 5 | High-power sputter | 45 | 30 | −160 | 230 | 0.11 | 0.20 | 0.31 | 1 |
| Comparative Example 1 | High-power sputter | 45 | 30 | −120 | 430 | 0.11 | 0.20 | 0.31 | 3 |
| Comparative Example 2 | High-power sputter | 45 | 30 | −120 | 430 | 0.11 | 0.20 | 0.31 | 1 |
| Comparative Example 3 | High-power sputter | 45 | 30 | −160 | 230 | 0.11 | 0.20 | 0.31 | 3 |
| Comparative Example 4 | High-power sputter | 45 | 30 | −80 | 200 | 0.11 | 0.20 | 0.31 | 1 |
| Comparative Example 5 | Arc ion plating | — | — | −100 | 500 | 4.0 | — | 3.5 | 3 |

<Film Composition>

For the film composition of the hard coating film, the film composition of the hard coating film was measured by the attached wavelength dispersive electron probe microanalysis (WDS-EPMA) using an electron probe microanalyzer device (JXA-8500F manufactured by JEOL Ltd.). The mirror-polishing of the ball end mill for physical property evaluation was performed to have an acceleration voltage of voltage of 200 kV, a limited field view region of ϕ1000 nm or more, a camera length of 100 cm, and an incident electron charge of 5.0 pA/cm² (on a fluorescent plate). The brightness of the selected area diffraction pattern was converted to obtain the intensity profile. The analysis location was near the center of the hard coating film in the film thickness direction. The results of the physical property evaluation arc summarized in Table 2.

TABLE 2

| Sample No. | Composition analysis | | | X-ray diffraction | | | TEM analysis | | Properties | |
|---|---|---|---|---|---|---|---|---|---|---|
| | Film composition (atomic %) | Ar content (atomic %) | Crystal structure | Full width at half maximum (FWHM) | I(111)/I(200) | Ih × 100/Is | | Crystal grain size (nm) | Nanoindentation hardness (GPa) | Elastic modulus (GPa) |
| Example 1 | (Al82Ti28)N | 0.06 | fcc | 0.38 | 0.9 | 4 8 | | Coarse30 Fine15 | 36 | 552 |
| Example 2 | (Al76Ti12Cr12)N | 0.06 | fcc | 0.35 | 108.8 | 0 | | 65 | 38 | 562 |
| Example 3 | (Al75Ti25)N | 0.05 | fcc | 0.48 | 1.54 | 0 | | 45 | 30 | 501 |
| Example 4 | (Al75Ti25)N | 0.04 | fcc | 0.43 | 2.92 | 6 | | 65 | 32 | 605 |
| Example 5 | (Al74Ti26)N | 0.05 | fcc | 1.00 | 2.19 | 3 | | 80 | 33 | 571 |
| Comparative Example 1 | (Al74Ti26)N | 0.53 | fcc + hcp | 1.00 | 0.7 | 20 | | 15 | 27 | 405 |
| Comparative Example 2 | (Al77Ti23)N | 0.38 | fcc + hcp | — | — | 29 | | 15 | 21 | 330 |
| Comparative Example 3 | (Al77Ti23)N | 0.24 | fcc + hcp | 1.12 | 1.04 | 25 | | 15 | 25 | 319 |
| Comparative Example 4 | (Al75Ti25)N | 0.12 | fcc + hcp | — | — | 0 24 | | Coarse75 Fine15 | 19 | 308 |
| Comparative Example 5 | (Al61Ti39)N | 0.00 | fcc | 0.57 | 0.49 | — | | — | 34 | 546 |

FIG. 1 shows an example of a cross-sectional, observation photograph by TEM of a hard coating film including a region mainly composed of relatively coarse particles and a region mainly composed of relatively fine particles. In FIG. 1, the vicinity of (a) is the region mainly composed of relatively coarse particles and the vicinity of (b) is the region mainly composed of relatively fine particles.

Figure 2:
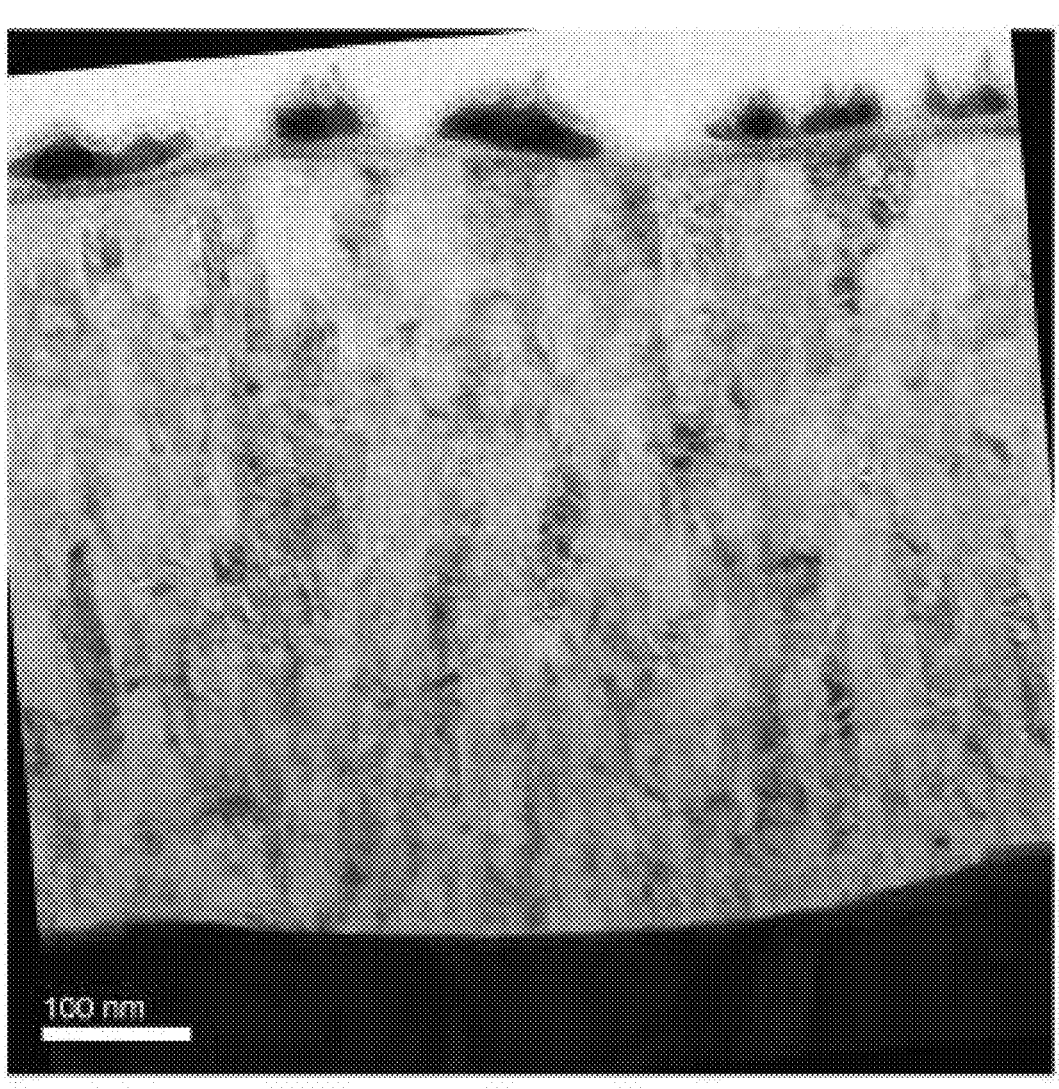
FIG. 2 is an enlarged photograph of a region mainly composed of relatively coarse particles in FIG. 1.
Figure 3:
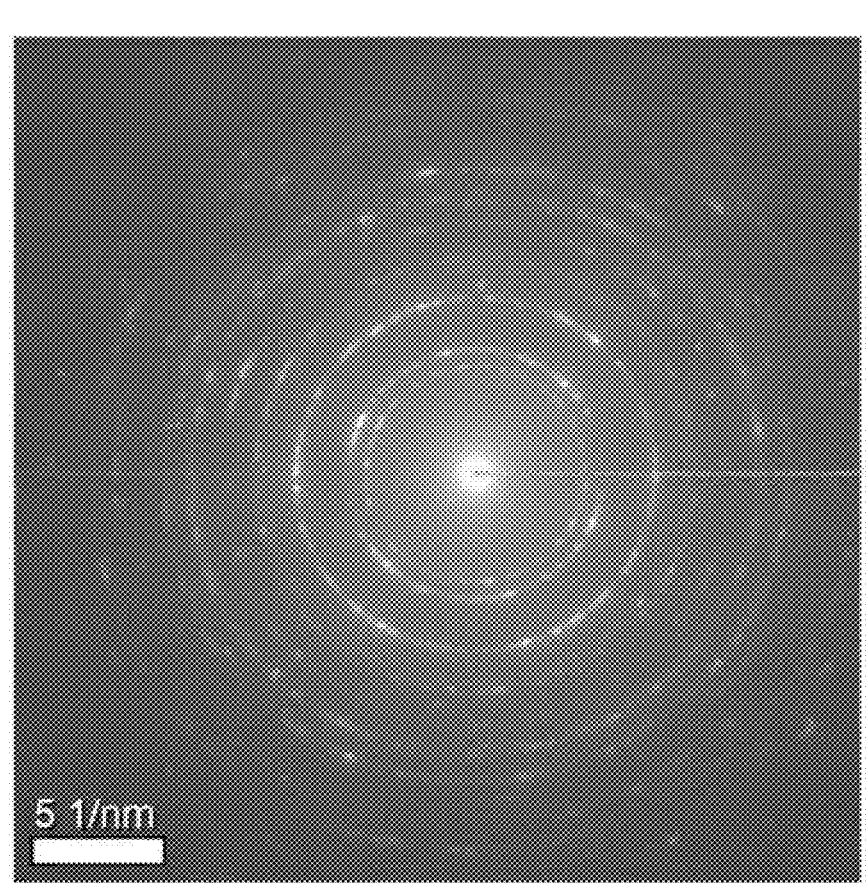
FIG. 3 is a diagram showing a selected area diffraction pattern in FIG. 2.
Figure 4:
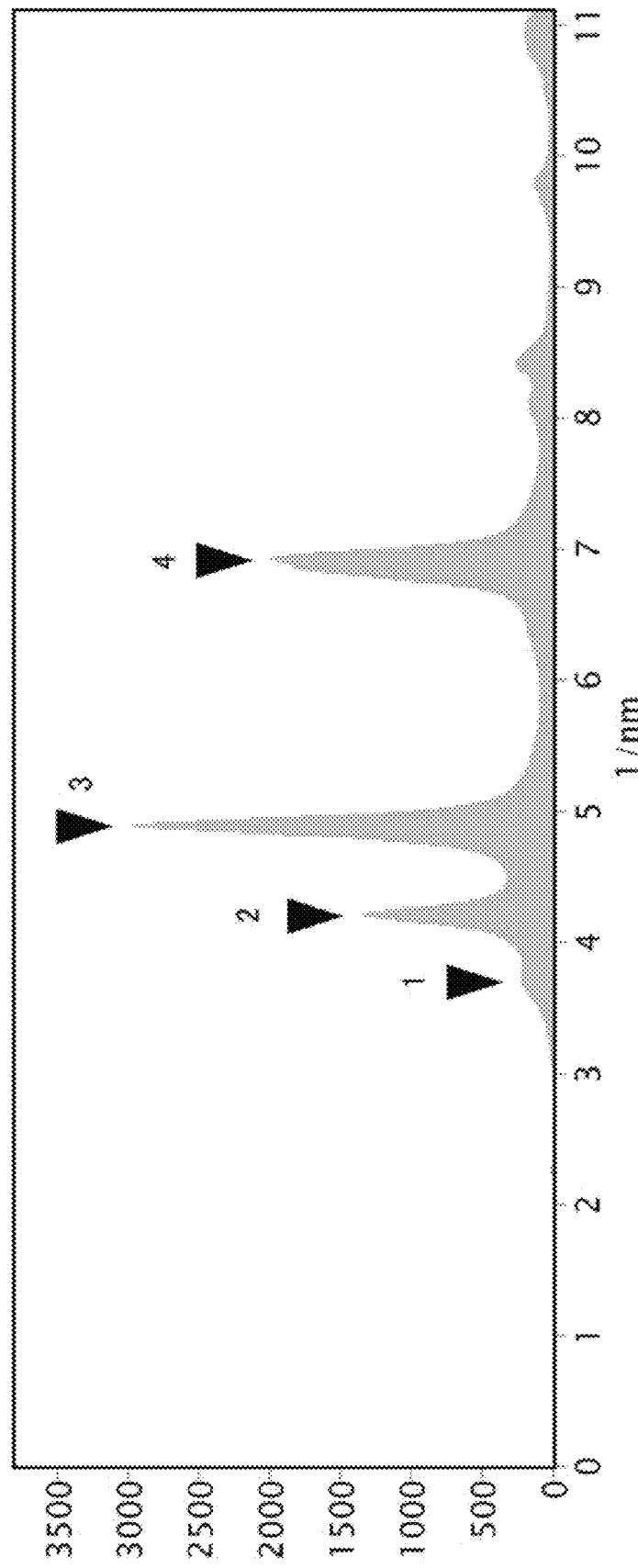
FIG. 4 is a diagram showing an intensity profile of the selected area diffraction pattern shown in FIG. 3.

FIG. 2 shows an example of an enlarged photograph of the region mainly composed of relatively coarse particles of FIG. 1. FIG. 3 is an example of a selected area diffraction pattern of the region mainly composed of relatively coarse particles. FIG. 4 is an example of a diagram showing an intensity profile of the selected area diffraction pattern shown in FIG. 3.

Figure 5:
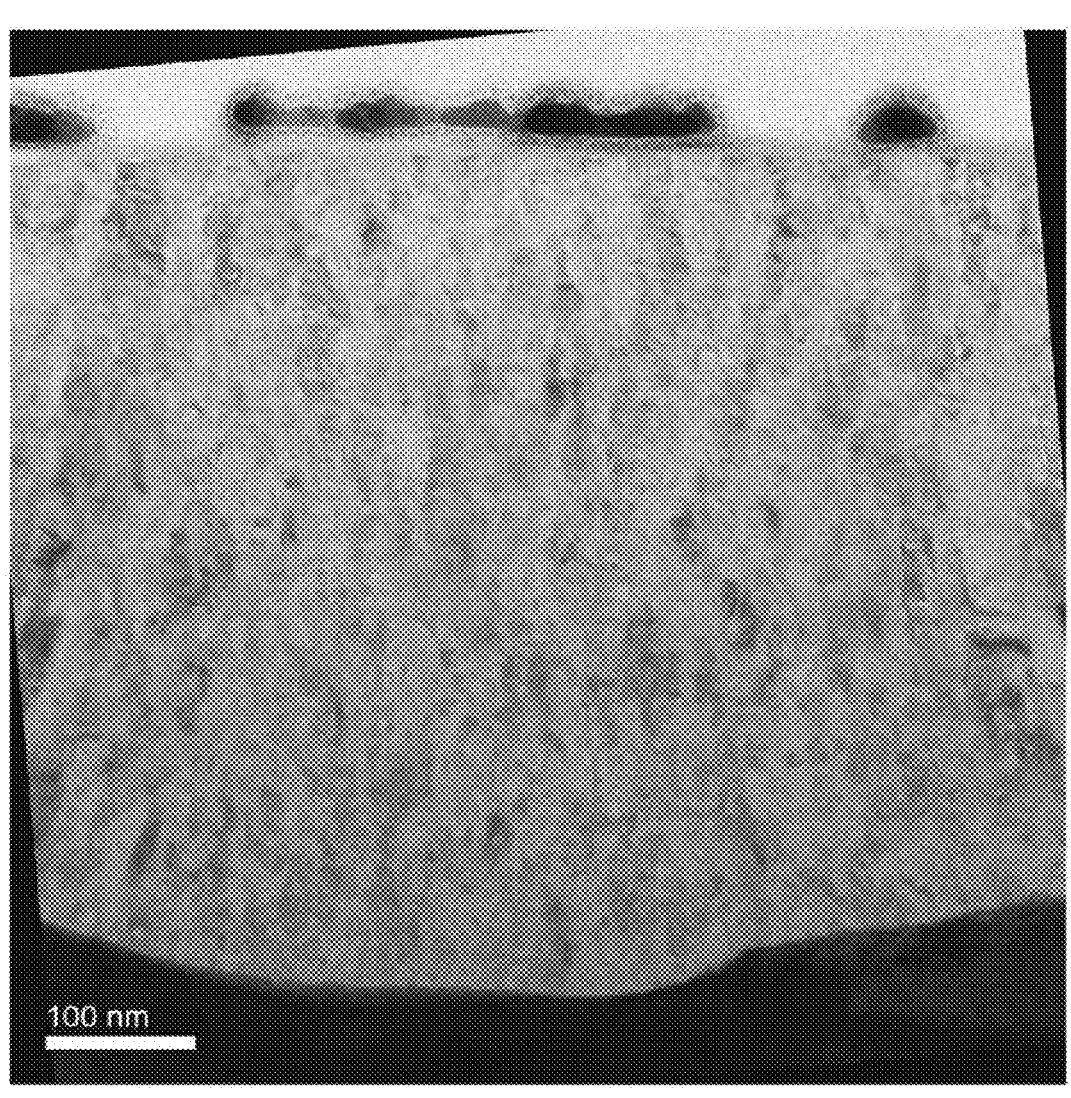
FIG. 5 is an enlarged photograph of the region mainly composed of relatively fine particles in FIG. 1.
Figure 6:
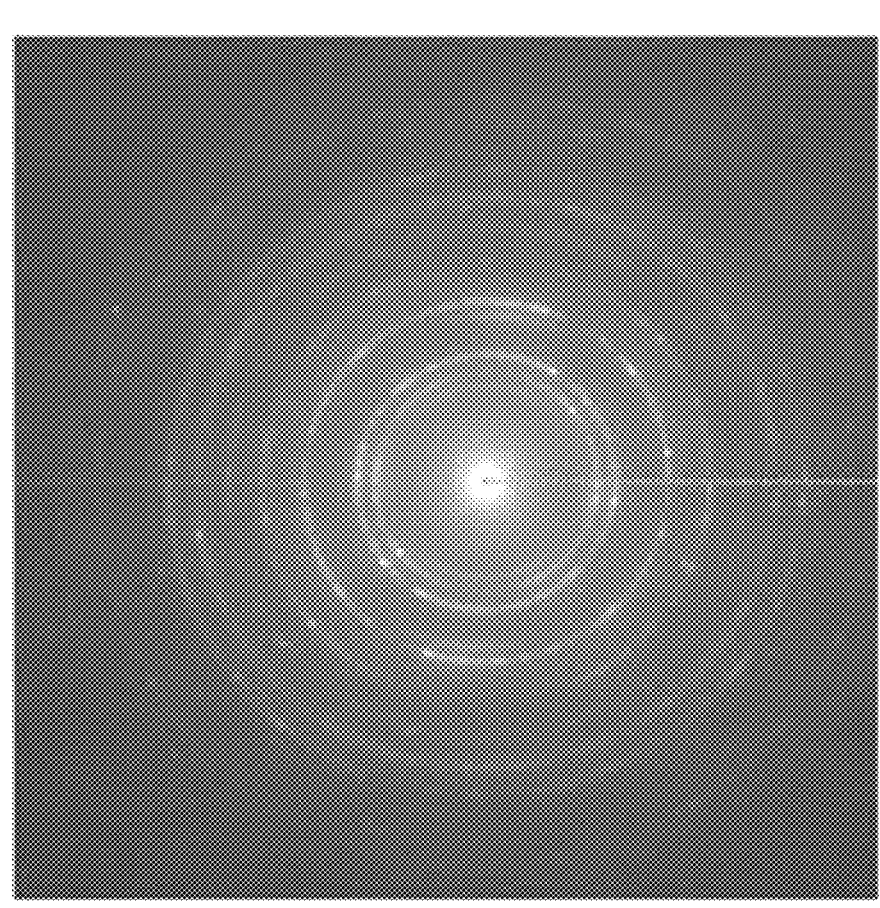
FIG. 6 is a diagram showing a selected area diffraction pattern in FIG. 5.
Figure 7:
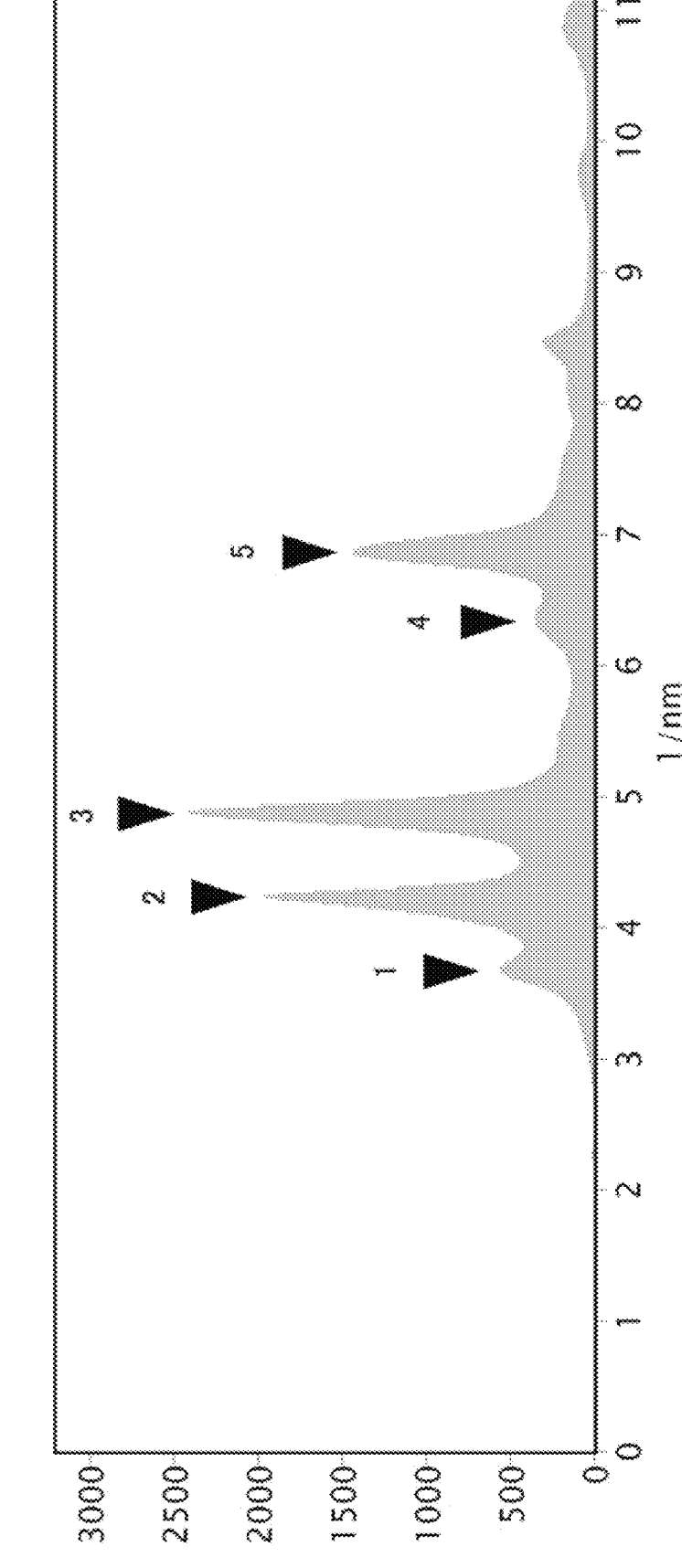
FIG. 7 is a diagram showing an intensity profile of the selected area diffraction pattern shown in FIG. 6.

FIG. 5 shows an example of an enlarged photograph of the region mainly composed of relatively fine particles of FIG. 1. FIG. 6 is an example of a selected area diffraction pattern of the region mainly composed of relatively fine particles. FIG. 7 is an example of a diagram showing an intensity profile of the selected area diffraction pattern shown in FIG. 6.

Ih×100/Is was calculated from the intensity profile shown in FIGS. 4 and 7. As a result, it was confirmed that the value of Ih×100/Is was smaller in the region mainly composed of relatively coarse particles than in the region mainly composed of relatively fine particles.

The hard coating film of Example 1 was a structure including a region mainly composed of relatively coarse particles and a region mainly composed of relatively fine particles. For the hard coating film of the other examples, the particle size of the particles was substantially uniform, and the value of Ih×100/Is was 10 or less. In the hard coating film of each example, the peak intensity of AlN having an hcp structure was not confirmed by X-ray diffraction, and MN having an hcp structure was slightly confirmed at the micro level. The hard coating films of Examples 1 to 5 had an argon content of 0.10 atomic % or less. Further, in the cross-sectional observation, the number of droplets having a circular equivalent diameter of 1.0 μm or more was 1 or less per 100 μm² and no droplets having a circular equivalent diameter of 5.0 μm or more were confirmed.

It was confirmed that the hard coating films of all the examples were Al-rich, but had few defects such as AlN, droplets, and argon in the hcp structure.

It was confirmed that the hard coating films of Examples 1 to 5 had a nanoindentation hardness of 30 GPa or more and an elastic modulus of 500 GPa or more.

Figure 8:
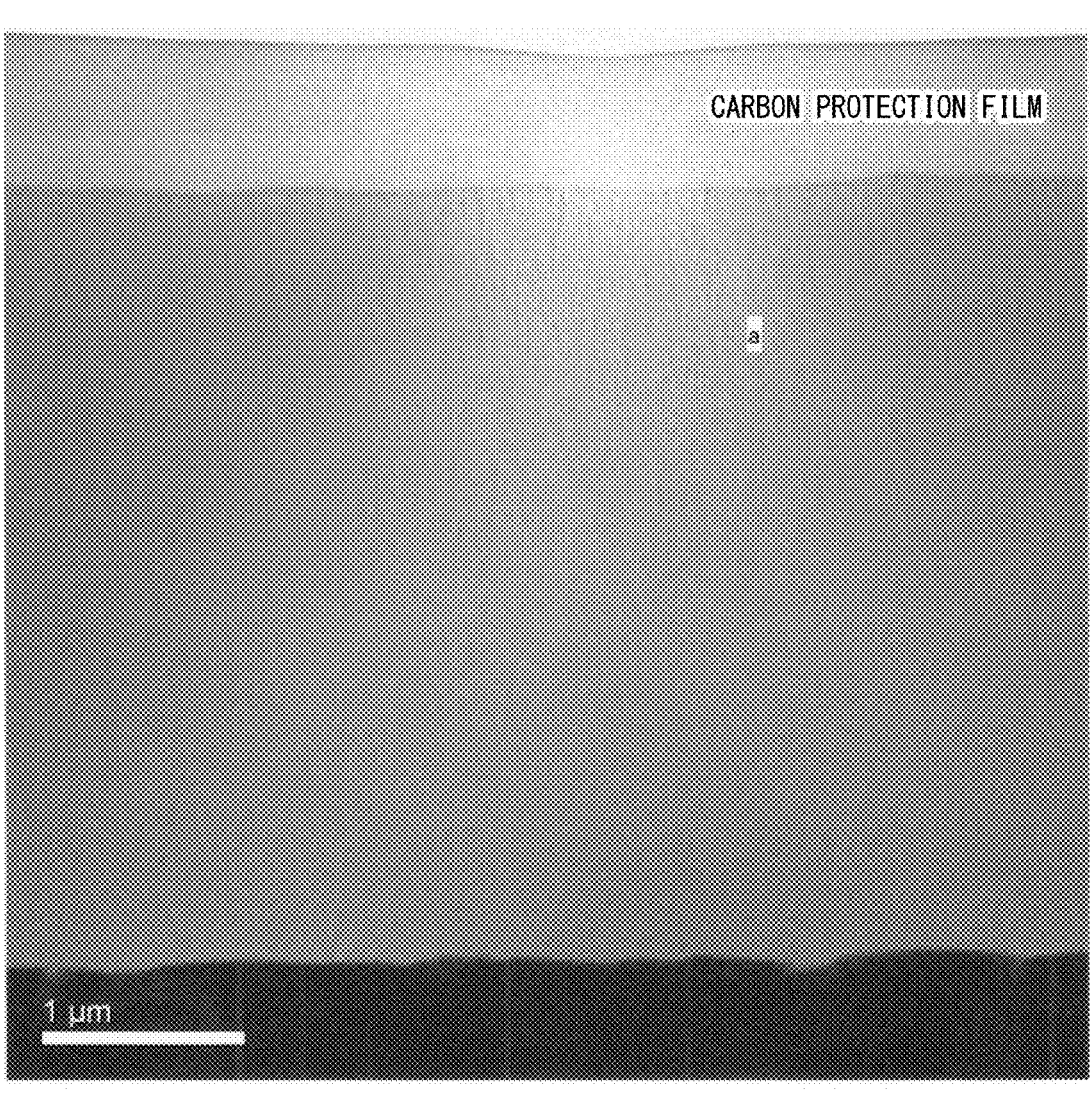
FIG. 8 is an example of a cross-sectional observation photograph by a transmission electron microscope of a comparative example.
Figure 9:
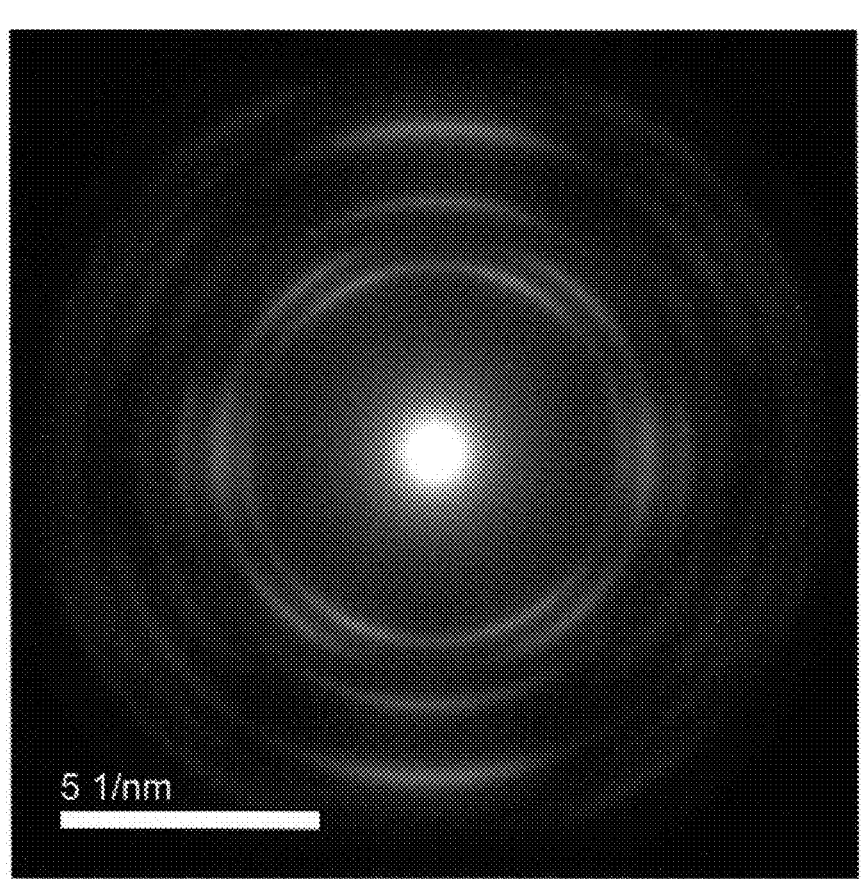
FIG. 9 is a diagram showing a selected area diffraction pattern of FIG. 8.
Figure 10:
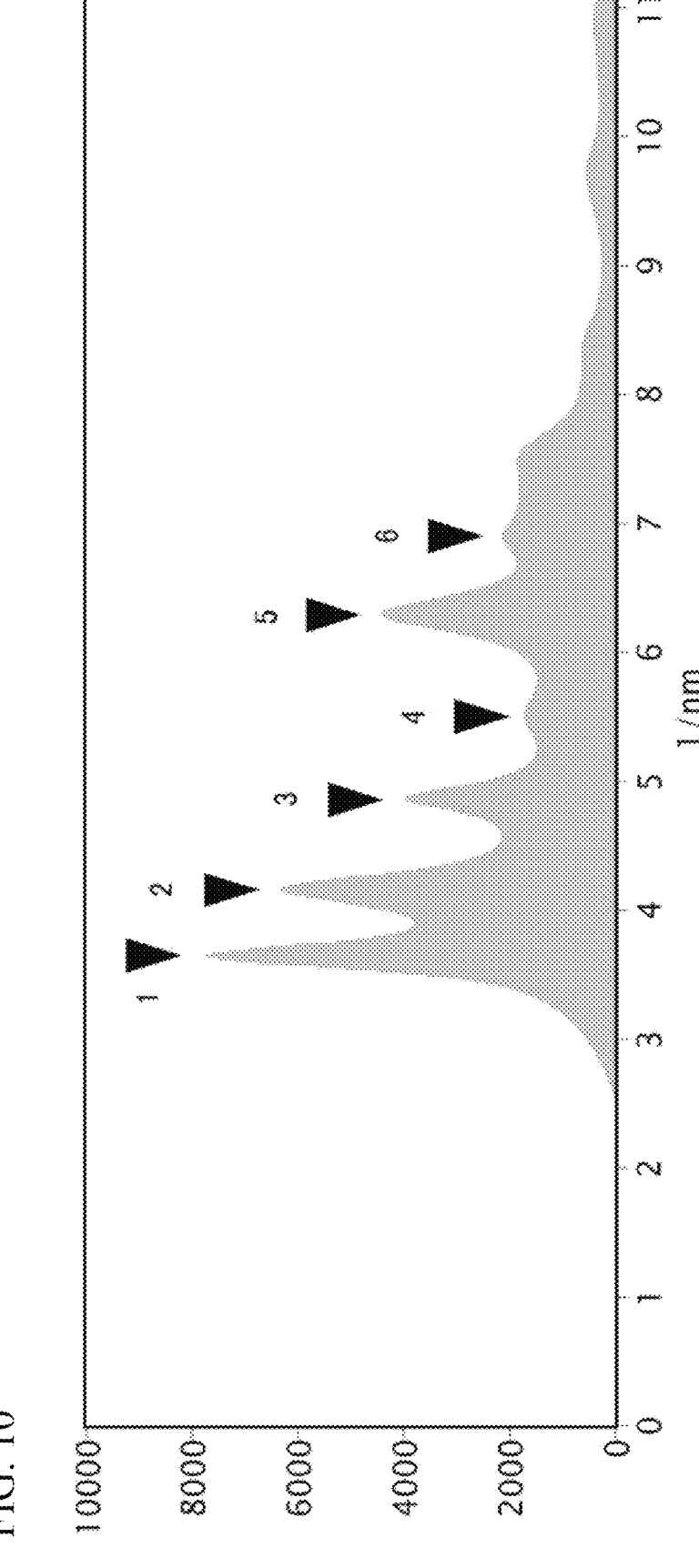
FIG. 10 is a diagram showing an intensity profile of the selected area diffraction pattern shown in FIG. 9.

FIG. 8 shows an example of a cross-sectional observation photograph by a transmission electron microscope for a hard coating film of Comparative Example 1. FIG. 9 is an example of a diagram showing a selected area diffraction pattern of FIG. 8. FIG. 10 is an example of a diagram showing an intensity profile of the selected area diffraction pattern shown in FIG. 9.

For the hard coating films of Comparative Examples 1 to 4, the peak intensity of AlN having an hcp structure was confirmed by X-ray diffraction, and the value of Ih×100/Is was also larger than that of Examples. For Comparative Examples 2 and 4, the peak intensity of the fcc (111) plane was not confirmed by X-ray diffraction. In addition, the content ratio of argon was also higher than in the examples. The hard coating film of Comparative Example 4 had a region mainly composed of relatively coarse particles and a region mainly composed of relatively fine particles. Ih×100/Is=0 was satisfied in the region mainly composed of relatively coarse particles, but Ih×100/Is=24 was satisfied in the region mainly composed of relatively fine particles.

It was confirmed that the hard coating films of Comparative Examples 1 to 4 had more defects due to either or both of AlN having an hcp structure and high-concentration argon as compared with the hard coating films of Examples 1 to 5.

It was confirmed that Comparative Examples 1 to 4 had lower hardness and elastic modulus than those of Examples. That is, if any one or more of the bias voltage, the film formation temperature, and the installation method deviates from the appropriate range, the defects of the obtained hard coating film tend to increase. As a result, it was confirmed that the hardness and elastic modulus of the hard coating film tend to decrease.

The hard coating film of Comparative Example 5 was coated by the arc ion plating method and contained a large amount of coarse droplets.

Example 2

In "Example 2", cutting evaluation was performed on the end mills of Example 1, Example 4, and Comparative Example 5 used in "Example 1". The processing conditions are as follows. The evaluation results are summarized in Table 3.

(Condition) Dry Processing

Tool: Two-flute ball end mill

Model number: EPDBE2010-6, ball radius 0.5 mm

Cutting method: Bottom cutting

Work Material: STAVAX (52HRC) (manufactured by Bohler-Uddeholm Co., Ltd.)

30, a hard coating film was coated directly above the base material. In a sample preparation step of Comparative Example 30, similarly to the sample preparation step of Example 1, the surface of the base material was coated with an intermediate film and then a hard coating film. Table 4 summarizes the film formation conditions of each sample.

TABLE 4

| Sample No. | Film forming method | Intermediate film | Maximum power (kw) | Power apply time (ms) | Bias voltage (V) | Film forming temperature (° C.) | N₂ pressure (Pa) | Ar pressure (Pa) | Total pressure (Pa) | Installation method |
|---|---|---|---|---|---|---|---|---|---|---|
| Example 30 | High-power sputter | No | 45 | 1 | −120 | 200 | 0.07 | 0.10 | 0.17 | 1 |
| Comparative Example 30 | High-power sputter | Yes | 45 | 1 | −120 | 200 | 0.07 | 0.10 | 0.17 | 1 |

TABLE 5

| | Composition analysis | | X-ray diffraction | | | TEM analysis | Properties | | |
|---|---|---|---|---|---|---|---|---|---|
| Sample No. | Film composition (atomic %) | Ar content (atomic %) | Crystal structure | Full width at half maximum (FWHM) | I(111)/I(200) | Ih × 100/Is | Crystal grain size (nm) | Nanoindentation hardness (GPa) | Elastic modulus (GPa) |
| Example 30 | (Al75Ti25)N | 0.09 | fcc | 0.40 | 12 | 0 | 80 | 40 | 473 |
| Comparative Example 30 | (Al73Ti27)N | 0.34 | fcc + hcp | 0.46 | 1 | — | — | 25 | 330 |

Notch: 0.03 mm in axial direction and 0.03 mm in radial direction

Cutting speed: 67.8 m/min

Single blade feed amount: 0.0135 mm/blade

Cutting distance: 15 m

Evaluation method: After cutting, observation was performed at a magnification of 1000 times using a scanning electron microscope, the width of the scraping between the tool and the work material was measured, and the portion with the largest scraping width was defined as the maximum wear width.

TABLE 3

| Sample No. | Maximum wear width of flank surface (μm) |
|---|---|
| Example 1 | 25 |
| Example 4 | 28 |
| Comparative Example 5 | 38 |

Since the hard coating films of Examples 1 and 4 were Al-rich and had few defects such as AlN, droplets, and Ar of hcp structure inside the film, it was confirmed that tool wear was suppressed as compared with Comparative Example 5, which was a hard coating film of the conventional arc ion plating method. In particular, it is presumed that the hard coating film of Example 1 has a region mainly composed of relatively fine particles, so that the maximum wear width of the flank surface is further suppressed.

Example 3

In "Example 3", an intermediate film was evaluated. In "Example 3", an Al80Ti20 alloy target was used for forming a hard coating film. In a sample preparation step of Example In Example 30 and Comparative Example 30, the coating conditions of the hard coating film are the same. A hard coating film having an hcp structure with a small amount of AlN was obtained at the micro level in Example 30 in which the hard coating film was provided directly above the base material, but a peak of AlN in an hcp structure was confirmed in the X-ray diffraction of the hard coating film in Comparative Example 30 in which the hard coating film was provided via the intermediate film.

By comparing Example 30 and Comparative Example 30, when the hard coating films were coated under the same conditions, it was confirmed that when the hard coating film was coated directly above the base material without providing the intermediate film, the crystal structure of the hard coating film was more likely to have a face-centered cubic structure and the AlN of the hcp structure tended to decrease.

The invention claimed is:

1. A coated tool comprising:

a base material; and a hard coating film on the base material, wherein the hard coating film is a nitride or carbonitride which contains aluminum (Al) of 70 atomic % or more and 90 atomic % or less and titanium (Ti) of 10 atomic % or more and 30 atomic % or less with respect to a total amount of metal (including metalloid) elements, a total of aluminum (Al) and titanium (Ti) of 85 atomic % or more, and argon (Ar) of 0.20 atomic % or less with respect to a total amount of metal (including metalloid) elements and non-metal elements, and wherein no peak intensity of AlN having a hexagonal close packed structure is detected in the X-ray diffraction of the hard coating, and the hard coating film satisfies a relationship of Ih×100/Is≤12 when a peak intensity due to a (010) plane of AlN of a hexagonal close-packed structure is Ih and a sum of a peak intensity due to a (111) plane of AlN, a (111) plane of TiN, a (200) plane of AlN, a (200) plane of TiN, a (220) plane of AlN, and a (220) plane of TiN of a face-centered cubic structure and a peak intensity due to a (010) plane of AlN, a (011) plane of AlN, and a (110) plane of AlN of a hexagonal close-packed structure is Is in an intensity profile obtained from a selected area diffraction pattern of a transmission electron microscope.

2. The coated tool according to claim 1,
wherein the hard coating film has a structure having a region mainly composed of relatively coarse particles and a region mainly composed of relatively fine particles.

3. The coated tool according to claim 2,
wherein an average crystal grain size of the region mainly composed of the relatively coarse particles is 1.2 times or more and 4.0 times or less the average crystal grain size of the region mainly composed of the relatively fine particles.

4. The coated tool according to claim 3,
wherein the value of Ih×100/Is is 0 or more and 8 or less in the region mainly composed of the relatively coarse particles and the value of Ih×100/Is is 4 or more and 12 or less in the region mainly composed of the relatively fine particles.

5. The coated tool according to claim 1,
wherein the hard coating film is provided directly above the base material.

6. The coated tool according to claim 1,
wherein the hard coating film has a nanoindentation hardness of 30 GPa or more and an elastic modulus of 500 GPa or more.

7. The coated tool according to claim 2,
wherein the hard coating film is provided directly above the base material.

8. The coated tool according to claim 3,
wherein the hard coating film is provided directly above the base material.

9. The coated tool according to claim 4,
wherein the hard coating film is provided directly above the base material.

10. The coated tool according to claim 2,
wherein the hard coating film has a nanoindentation hardness of 30 GPa or more and an elastic modulus of 500 GPa or more.

11. The coated tool according to claim 3,
wherein the hard coating film has a nanoindentation hardness of 30 GPa or more and an elastic modulus of 500 GPa or more.

12. The coated tool according to claim 4,
wherein the hard coating film has a nanoindentation hardness of 30 GPa or more and an elastic modulus of 500 GPa or more.

13. The coated tool according to claim 5,
wherein the hard coating film has a nanoindentation hardness of 30 GPa or more and an elastic modulus of 500 GPa or more.

14. The coated tool according to claim 7,
wherein the hard coating film has a nanoindentation hardness of 30 GPa or more and an elastic modulus of 500 GPa or more.

15. The coated tool according to claim 8,
wherein the hard coating film has a nanoindentation hardness of 30 GPa or more and an elastic modulus of 500 GPa or more.

16. The coated tool according to claim 9,
wherein the hard coating film has a nanoindentation hardness of 30 GPa or more and an elastic modulus of 500 GPa or more.

* * * * *